United States Patent [19]

Hillenius et al.

[11] Patent Number: 5,373,180
[45] Date of Patent: Dec. 13, 1994

[54] PLANAR ISOLATION TECHNIQUE FOR INTEGRATED CIRCUITS

[75] Inventors: Steven J. Hillenius; William T. Lynch, both of Summit; Lalita Manchanda, New Providence; Mark R. Pinto, Morristown; Sheila Vaidya, Watchung, all of N.J.

[73] Assignee: AT&T Corp., Murray Hill, N.J.

[21] Appl. No.: 121,082

[22] Filed: Sep. 14, 1993

Related U.S. Application Data

[63] Continuation of Ser. No. 833,575, Feb. 10, 1992, abandoned, which is a continuation of Ser. No. 387,478, Jul. 28, 1989, abandoned.

[51] Int. Cl.[5] .............................................. H01L 27/04
[52] U.S. Cl. ................................. 257/357; 257/397; 257/508; 257/514; 257/520; 257/622
[58] Field of Search ....................... 357/49, 55, 50; 257/357, 397, 508, 514, 520, 622

[56] References Cited

U.S. PATENT DOCUMENTS

| | | | |
|---|---|---|---|
| 4,571,819 | 2/1986 | Rogers et al. | 257/520 |
| 4,825,278 | 4/1989 | Hillenius | 357/53 |
| 5,045,904 | 9/1991 | Kobayashi et al. | 357/50 |

OTHER PUBLICATIONS

VSLI Technology, 2nd ED, Edited by S. M. Sze, 1988.
Sze, supra, Chapter 11.
Sze, supra, Chapter 6.
Sze, supra, Chapter 5.

*Primary Examiner*—Edward Wojciechowicz
*Attorney, Agent, or Firm*—Bruce S. Schneider

[57] ABSTRACT

Through the use of a specifically configured buried dielectric region, devices with strict design rules, e.g., design rules of 0.9 micrometers and less, are significantly improved. In particular, the recessed dielectric region, e.g., field oxide, separating device areas in an integrated circuit, either has a buried conducting shield surrounding the periphery of the oxide or has a configuration such that the upper surface of the dielectric is no more than 20 nm below the upper surface of the silicon forming the device active region. By insuring a suitable configuration, parasitic capacitance resulting in slower operation is considerably reduced while leakage currents are maintained at an acceptable level.

15 Claims, 3 Drawing Sheets

FIG. 4A
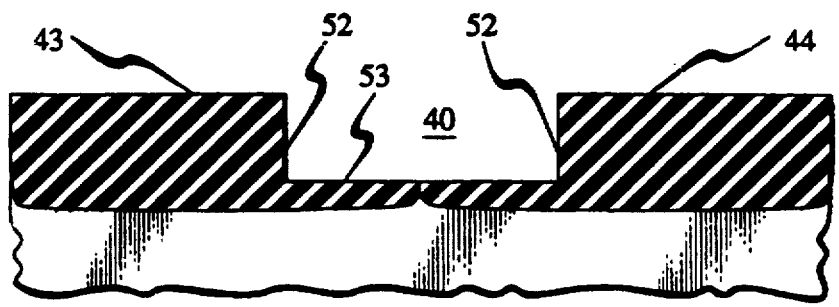
FIG. 4B
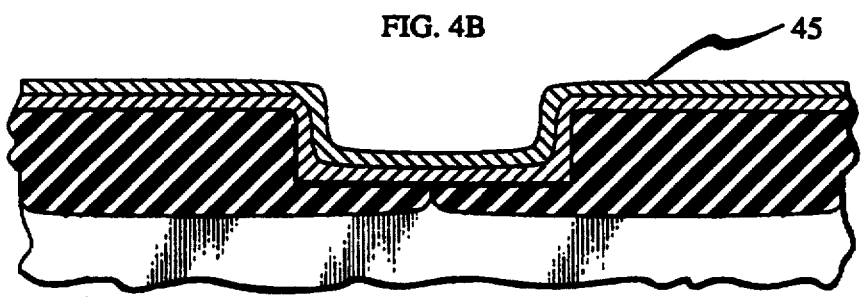
FIG. 4
FIG. 4C
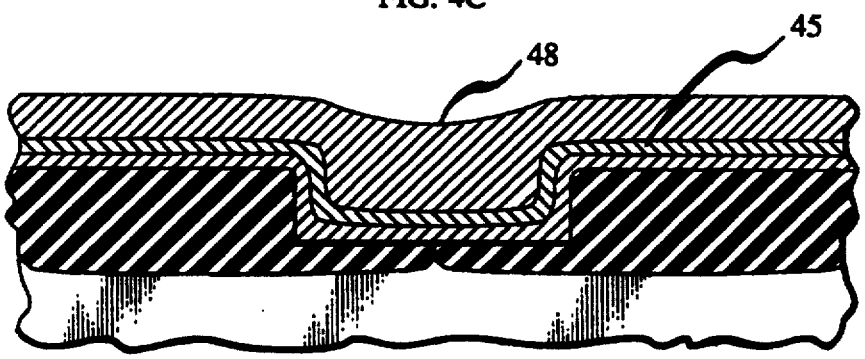
FIG. 4D
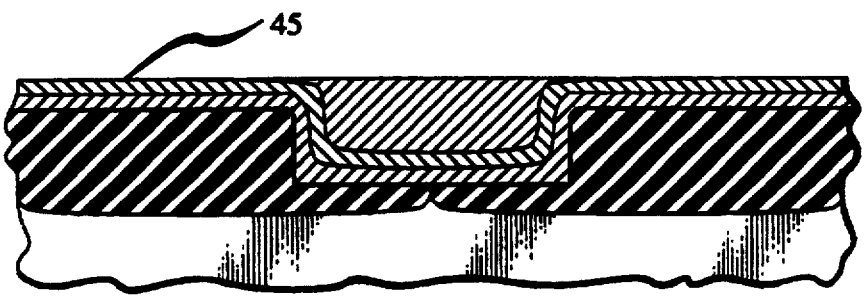

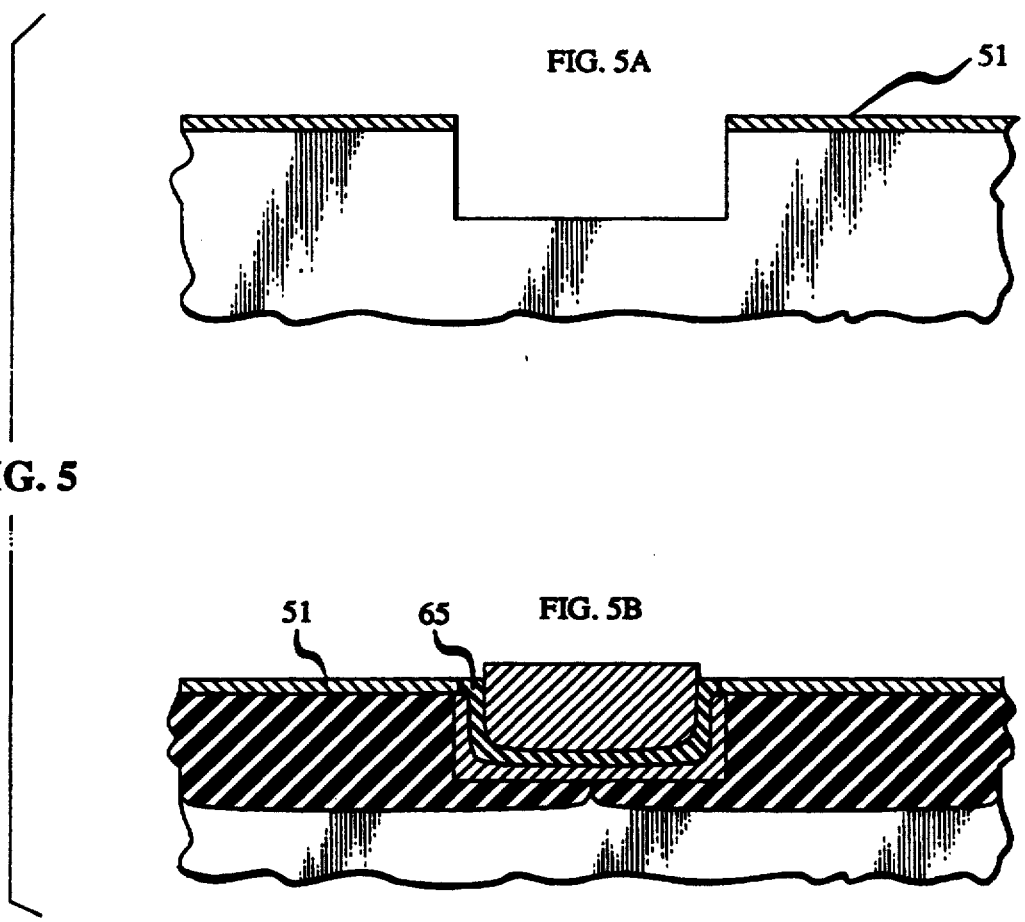

PLANAR ISOLATION TECHNIQUE FOR INTEGRATED CIRCUITS

This application is a continuation of application Ser. No. 07/833,575, filed on Feb. 10, 1992, now abandoned, which is a continuation of Ser. No. 07/387,478, filed on Jul. 28, 1989 (now abandoned).

BACKGROUND OF THE INVENTION

1. Field of the Invention

This invention relates to semiconductor devices and, in particular, semiconductor devices employing large area oxides such as field oxides.

2. Art Background

In a variety of electronic devices, relatively large areas, e.g. 20 to 90 percent of the device surface area of dielectric material, are employed to isolate one device active region from another and/or to prevent electric fields in one region from adversely affecting active devices in another region. Examples of such large oxide regions are the field oxide in MOS technology as well as the field oxide isolation region in bipolar technology. In the former case, typical configurations are shown in FIG. 1, where 10 and 11 are the respective drains of field effect transistors 8 and 9, while 12 and 13 are the sources and 15 and 16 are the gates of these transistors.

Interconnection between gates must be configured so that the electrical conductors producing these connections do not adversely affect device operation and such that the operation of one field effect transistor does not adversely interfere with the operation of another. Typically, these desires are satisfied by a field oxide 17. This field oxide is usually thermally grown to a sufficient thickness-generally in the range 100 to 1000 nm—to prevent electric fields generated from runners that connect gates and junctions by traversing the region over the field oxide from producing a charge inverted region under the oxide. This inversion allows leakage currents to flow under the field oxide region between transistors. Similarly, in bipolar technology, a large oxide is employed typically for the same reason.

As design rules become stricter, i.e., as design rules decrease from 1 $\mu$m to 0.6 $\mu$m and finer, the large non-planarities associated with the large area dielectric regions produce significant processing difficulties. For example, a photoresist deposited on a non-planar surface generally assumes substantially the same contour as that surface. Thus, images focused on the photoresist, although in focus at one point on the resist surface, will be out of focus in the other regions of the resist surface that are not co-planar with the first. Thus, lithographic resolution is degraded.

Additionally, when etching a non-planar surface, further difficulties occur. As gate material in region 4 is etched and cleared, there remains a portion typically denominated a stringer, which must also be removed by further etching after the gate material has been removed from surfaces 20 and 21. However, this removal exposes surfaces 20 and 21 to further etching and therefore possible degradation. As a result, non-planarities for strict design rules are preferably avoided.

Attempts have been made to limit non-planarities introduced by large area dielectrics through the thinning of the dielectric, e.g. oxide, employed. These attempts have yielded unsatisfactory results. In particular, with thin dielectrics, such as thin field oxides, electric fields produced in the overlying electrical runners strongly affect the silicon underlying the oxide. The result of this interaction is two-fold. Capacitance increases which yields a decrease in device speed. Additionally, voltages through the runner must be limited so that the region 2 is not sufficiently inverted to produce substantial leakage currents, e.g., $10^{-7}$ to $10^{-9}$ amps between devices 8 and 9. Attempts to compensate for the effects of a thinned field oxide by increasing dopant levels in the substrate also lead to increased junction capacitance. As a result, although non-planarities associated with the field oxide cause undesirable effects, improvement has not been possible.

SUMMARY OF THE INVENTION

By employing a large area dielectric, e.g., field oxide, formed in a trench that meets specific geometric requirements, the isolation purposes of the dielectric are maintained while planarity and its associated benefits are obtained. In particular, either buried conducting region(s), 30, that are essentially coextensive with the oxide sidewall should be formed as shown in FIG. 3, or in the absence of these region(s), the surface of the field oxide should be no less than 20 nm above the surface of the silicon in which the active region is defined as shown in FIG. 2 and the dopant level in the silicon active region to a depth of at least 1000 Å from the surface should be at least $10^{17}$ atoms/cm$^3$ at the silicon/field oxide interface.

Various methods are possible for producing the desired configuration. In one embodiment, a trench is formed in the active region. The surface of the trench is oxidized, a layer of polysilicon is deposited, field oxide is deposited over the polysilicon in the trench and then etched back to the desired geometric configuration.

BRIEF DESCRIPTION OF THE DRAWING(S)

FIG. 1 is illustrative of typical configurations employed in the art; FIGS. 2 and 3 are illustrative of configurations involved in the invention; and FIGS. 4a–4d and 5a–5b are illustrative of fabrication procedures involved in the invention.

DETAILED DESCRIPTION

Figure 1:
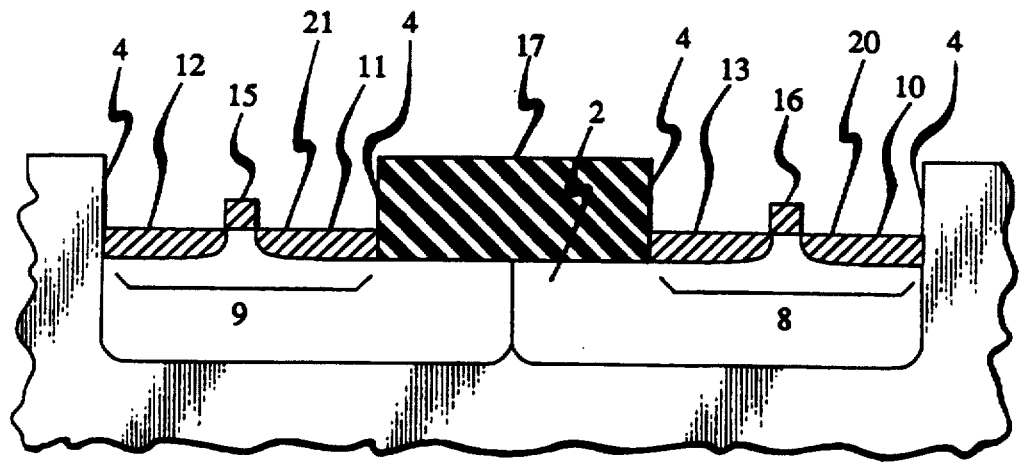
Figure 2:
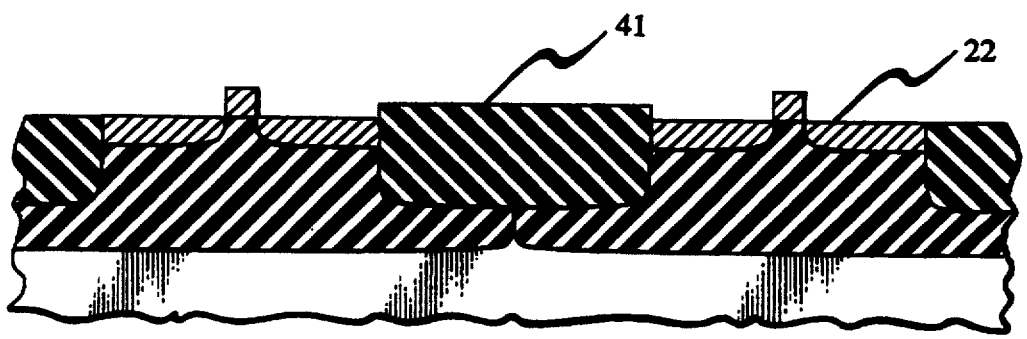
Figure 3:
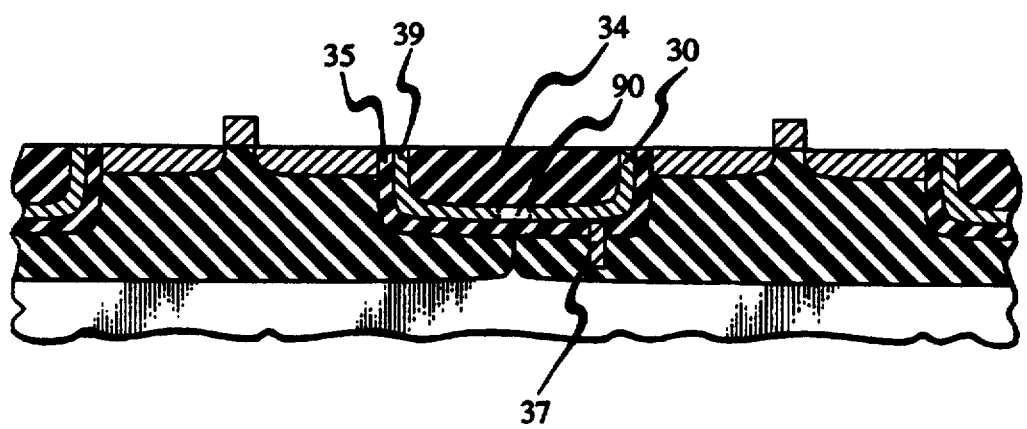

As discussed, a trench-filled large area dielectric with a specific configuration allows production of an essentially planar region while avoiding stray capacitance or undesired depletion effects. (In the context of this invention the term trench-filled is not used to denote fabrication sequence but merely to indicate appearance after fabrication is complete. Thus, for example, it is possible to form the device by building the field oxide region, and then surrounding it by an active region or by first etching a trench and filling the trench with the appropriate field oxide region. Additionally, a trench field oxide is a field oxide having less oxide above the substrate surface than field oxide below this surface.) The particular geometries required are shown in FIGS. 2 and 3. The conducting region should be essentially coextensive with the sidewall. In FIG. 3 a buried conducting region 30 between dielectric regions 34 and 35 is present. In this configuration the conducting region generally should have a cross-section in the range 20 nm to 200 nm measured along the direction perpendicular to the trench sidewall at the midpoint between the lowest point of the trench and the upper major surface of the silicon. Regions thinner than 20 nm are difficult to produce without pin holes or voids, while regions thicker than 200 nm tend to undesirably increase capacitance to the gate runner and/or require a significantly deeper trench.

Typically, the resistivity of the region should be less than 0.1 ohm-cm. Resistivities more than 0.1 ohm-cm lead to the possibility of transitory charge accumulation and poor contact to the substrate. The resistivity, when the conducting region is polysilicon, is generally adjusted by introducing n- or p-type dopants such as boron, arsenic, antimony and/or phosphorus. (N-type dopants are typically used over an N-tub and p-type dopants over a p-tub.) Typically dopant concentrations in the range $10^{16}$ to $10^{21}$ cm$^3$ yield the desired resistivity. The presence of the conducting region along the sidewall is significant. Presence of this region along the trench bottom has a less significant effect and is not essential because the field produced by the electrical conductors does not cause leakage between active devices when there is a conductor region at the sidewalls. Thus, presence of a conducting region along the trench bottom, although often desirable, is not essential.

The thickness of the oxide, 35, between the buried conductive layer and the trench walls should typically be in the range 10 to 50 nm. Additionally, the top edge, 39, of the conducting region 30 should preferably be oxidized to avoid shorting between the conducting region and the gate interconnect. If a buried conducting region is employed, the upper region 34 of the field oxide should be sufficiently thick to avoid excessive parasitic capacitance in the gate interconnect, e.g. should not contribute more than 10% to parasitic capacitance. In practice, the conductive region is electrically connected such as at 37 to the tub region so that the conducting layer is maintained at the tub potential. This connection is made by techniques such as etching of the thin oxide between the tub and the conducting region using standard lithographic techniques followed by formation of the conductive layer including the interconnection. In a CMOS device this connection is made preferably to 1) the p tub or to 2) both the p tub and n tub. Additionally, if connection is made to both tubs the conducting region should be broken (shown in phantom at 90 in FIG. 3).

In the embodiment shown in FIG. 2 a buried conductive region is not employed. The surface of dielectric in this embodiment should be carefully controlled. To produce the desirable results associated with the invention, the surface 41 of the dielectric, e.g., field oxide, should be no less than 20 nm above the surface 22 of the active region and the dopant level in the silicon active region to a depth of at least 1000 Å from the surface should be at least $10^{17}$ atoms/cm$^3$ at the silicon/field oxide interface. (Above, as used in this context, means measured from the silicon surface in the direction of the overlying oxide. The active region is any region containing an active device such as a capacitor, transistor, diode and resistor.) Since substantial non-planarities are not desirable, it is advantageous to not substantially exceed the 20 nm step requirement.

In either embodiment the dielectric region, 21 or 34, should have a thickness generally in the range 100 nm to 1000 nm. Thicknesses less than 100 nm lead to excessive capacitance, while thicknesses greater than 1000 nm lead to difficulties in maintaining planarity. Suitable materials for the dielectric region, e.g., field oxide, are thermal oxides, spin-on oxides and deposited oxides such as chemical vapor deposited oxides.

A convenient procedure for producing the embodiment shown in FIG. 3 is illustrated in FIG. 4. In this procedure a trench 40 is etched in the desired location. For CMOS applications, typically the trench is positioned between the active devices within a tub and/or positioned between tubs 43 and 44. In the latter case, as previously discussed, it is possible to etch an opening in the electrical conductor at the bottom of the field oxide. This objective is achieved in one embodiment by conventional photolithography or by depositing a dielectric, e.g. oxide or nitride, along the trench sidewalls over the conductor by a process described in Sze, supra, Chapter 11. This dielectric is then used as a mask for etching all of the conductor at the trench bottom or is used to convert the conductor through processes such as oxidation to an insulator. The photolithography mask used to etch openings in the conductor between tubs at the bottom of the field oxide need not be employed if a silicon region containing no active devices, surrounded by field oxide, and overlying the boundary region between p and n tubs is present. This silicon region is definable during the original trench etching. In this configuration the conductive region need not be present at the sidewalls of the silicon region having no active devices.

Generally, the depth of the trench should be in the range 100 nm to 1000 nm. Trenches shallower than 100 nm lead to excessive capacitance while trenches deeper than 1000 nm are inconvenient to etch. A dielectric material is then formed on the exposed surfaces 52 and 53. Generally, this material is a dielectric, or combination of dielectrics, such as a thermal oxide, deposited oxide, or a deposited dielectric, e.g. silicon nitride formed as described in *VLSI Technology:* 2nd Edition, Edited by S. M. Sze, McGraw Hill, 1988, Chapter 3. Surface 43 and 44 should also be protected by a dielectric such as the same dielectric that is found on the surface 52 and 53.

A layer of polysilicon 45 as shown at 4B, having the thickness previously described, is then deposited onto the oxide. Suitable procedures for depositing the polysilicon are chemical vapor deposition and sputter deposition as described in Sze, supra, Chapter 6. It is also possible to electrically connect the buried conducting region to a tub region by a process such as described in U.S. Pat. No. 4,825,278 dated Apr. 25, 1989, which is hereby incorporated by reference. The dielectric material, 48, is then deposited as shown in 4C. A convenient method for producing this dielectric is by using spin-on glasses as described in U.S. Patent application Ser. No. 161,876, filed Feb. 29, 1988 (Smolinsky and Ryan which is hereby incorporated by reference). A sufficient thickness of dielectric should be deposited so that the surface in region 48 is higher than the surface of the polysilicon in region 45.

To planarize closely spaced features, a sacrificial layer sufficiently thick to planarize the oxide layer is then deposited. This sacrificial layer is advantageously photoresist material. The photoresist material is then etched utilizing plasma-assisted procedures and plasma compositions such as described in Sze, supra, Chapter 5. Etching is continued until sufficient oxide is removed to yield the configuration shown in FIG. 4D. The exposed polysilicon over the active region is removed, for example, by conventional reactive ion etching while retaining the polysilicon along the sidewalls and bottom of the field oxide area. The edge of the exposed polysilicon region at the top of the sidewall is then passivated, for example, by thermal oxidation.

In one advantageous approach to planarize widely spaced features, the field oxide layer of thickness approximately equal to the trench depth is deposited, e.g. by means of chemical vapor deposition, and photoresist or other radiation definable material is deposited on the oxide layer. This material is then delineated by conventional techniques. The pattern of delineation is carefully chosen. In particular, the pattern is the negative of the trench mask and this negative pattern is reduced on all edges by a distance of at least the thickness of the deposited oxide. (If after this reduction, two edges are separated by less than the lithographically minimum resolvable dimension, they are eliminated from the defined pattern.)

After this delineation the unmasked oxide is etched until the underlying polysilicon is exposed in the area overlying the active region. (The polysilicon acts as an etch stop for common etchants such as a chlorofluorocarbon based plasmas used to etch the oxide. Therefore, overetching is not a problem.) The result of this oxide etch is the production of notches in the field oxide. These notches have tapered edges along the trench faces and nearly vertical edges defined by the mask edges. These notches are relatively small. The widths of the resulting notches, measured at their top, vary depending on trench dimension from a minimum width equal to the oxide thickness to a maximum width equal to the minimum resolvable dimension of the lithographic tool plus two oxide thicknesses. Typically, therefore, for an oxide thickness of 0.5 $\mu$m and a minimum resolvable dimension of 1 $\mu$m, the widths at the top of the notches range from approximately 0.5 $\mu$m to approximately 2.0 $\mu$m. The widths at the bottom of the notches range from approximately zero to 1.0 $\mu$m. At least one edge of each notch is tapered. Therefore after removal of the masking material a second deposition of oxide easily fills these notches without leaving voids or producing a significant nonplanarity in the resulting surface. Etching of this surface therefore easily produces a planar field oxide even for extremely large area field oxide regions. The polysilicon layer overlying the active region once again acts as a convenient etch stop and as a protector of the active regions. It is possible to remove the exposed polysilicon layer and to process the then exposed active area to produce active devices and interconnects. The removal of the exposed polysilicon also results in a desirable extension of the field oxide region extending above the plane of the active area.

In an alternative procedure, before etching to obtain the configuration shown in FIG. 4A, an etch stop 51 such as silicon nitride (or silicon nitride over an oxide) is blanket deposited and simultaneously etched with the underlying silicon leaving the configuration shown in 5A. An oxide is then produced along the trench walls by thermal oxidation. Subsequently, a polysilicon region and the dielectric region are formed by deposition. The field oxide region and the exposed polysilicon are then etched back as shown in 5B to expose the nitride region 51. It is possible to then remove and passivate the edge 65 of the polysilicon by means of selective polysilicon etching and subsequent oxidation. (Subsequent nitride removal is also possible.) This alterative procedure for producing a buried conductive region has the advantage of ensuring that the field oxide layer extends above the silicon surface and the conducting layer is protected by an oxide.

As previously discussed, another embodiment involves forming a continuous field oxide over the surface of the substrate, etching regions in this continuous field oxide for the active regions, forming the sidewall conducting regions, and then using selective epitaxial processes to form the active region of silicon in the previously etched areas.

To produce the configuration of the second embodiment shown in FIG. 2, a similar procedure is utilized, except a deposition of a conductive polysilicon layer is omitted. Subsequent processing to produce the desired device is well-known. Examples of this processing are described in reviews such as Sze, supra, Chapter 11.

The use of a buried conductive region in a planar large area oxide is also useful in bipolar technology to prevent inversion below field oxide regions. The procedure described for forming such a region is essentially the same as those discussed in conjunction with CMOS technology.

The following example is illustrative of of procedures involved in the invention.

EXAMPLE

A silicon substrate (major surface in the 100 crystallographic plane) was processed. A thermal oxide 350 Å in thickness was grown on both major surfaces of the substrate using an oxygen ambient and a temperature of approximately 900° C. A silicon nitride layer approximately 2000 Å in thickness was deposited on the thermally grown oxides utilizing low pressure chemical vapor deposition including a $SiH_2Cl_2 + NH_3$ gas flow. A thin layer of oxide was then formed on the nitride through thermal oxidation at 900° C. in oxygen. Regions were opened in a positive acting, near ultraviolet resist spun onto the active side of the wafer. These openings were at locations where the field oxide ultimately was to be formed. The exposure and development of the resist was done by conventional lithographic techniques. The uncovered regions of the thin oxide and underlying nitride were then etched utilizing a conventional reactive ion etching procedure with the plasma gas including 10 sccm of Freon 23 ($CHF_3$)and 90 sccm of $O_2$. Etching through the nitride took approximately 4.2 minutes and an overetch was employed to ensure complete clearing. After etching the resist was removed.

Using the patterned silicon nitride as a mask, trenches were etched into the silicon wafer. The trench etching was done utilizing a plasma gas including 85 sccm of $CFCl_3$ 16 sccm of $Cl_2$ and 90 sccm of Ar. The etching was continued until a depth of 5000 Å was reached. The exposed surfaces of the trench were then oxidized in steam at 900° C. for 8 minutes. This oxidation produced an oxide layer approximately 500 Å in thickness. To produce a clean, undamaged surface the grown oxide was removed by immersing the wafer in a 30 to 1 aqueous HF solution. An oxide was again grown on the trench walls utilizing an oxygen ambient and a temperature of 900° C. The oxidation was continued until an oxide thickness of 250 Å was obtained. The grown oxide was then cleaned by immersing for 30 seconds in a 100 to 1 aqueous HF solution.

Immediately after cleaning, 1000 Å of polysilicon was deposited by utilizing a low pressure chemical vapor deposition technique with silane as the precursor gas. A 200 Å thick silicon dioxide layer was formed on the polysilicon surface by oxidizing in oxygen at 900° C. A 5000 Å layer of undoped silicon dioxide was then deposited by subjecting the wafer at a temperature of 750° C. to an atmosphere of tetraethoxysilane together with a dry $N_2$ flow. All the silicon dioxide, except on the sidewalls of the trench, was removed by subjecting the wafer to a reactive ion etching atmosphere including 75 sccm of $CHF_3$ and 12 sccm of $O_2$ for 12.5 min with a short overetch. Utilizing the remaining silicon dioxide as a mask, the exposed regions of the polysilicon were removed utilizing a plasma struck in molecular chlorine. The etching was continued until the polysilicon was removed. To form the field oxide region, 1 $\mu m$ of silicon dioxide was deposited utilizing the tetraethoxysilane low pressure chemical vapor deposition process previously described. The structure was then planarized by polishing using simultaneous mechanical and chemical polishing.

Cross-sectional transmission electron microscopy of the resulting structure showed an essentially planar substrate having a buried field oxide and a conducting region separated from the trench sidewalls by a thin oxide.

We claim:

1. A semiconductor device comprising 1) a substrate, 2) first and second active regions and (3) a region of dielectric material, said dielectric material positioned and configured to limit interaction of charge or electric field through said substrate CHARACTERIZED IN THAT said dielectric material occupies a trench between said first and second active regions and an electrically conductive region is present in said dielectric material along the sidewalls of said trench adjacent said active regions wherein said conductive region is less than about 200 nm in thickness measured along the direction perpendicular to said sidewall at the midpoint between the lowest point of said trench and the upper major surface of said substrate and said conductive region is separated from said active region by a portion of said dielectric material and wherein said conductive region it is maintained at essentially the same potential as said substrate.

2. The device of claim 1 wherein said device comprises an integrated circuit including field effect transistors in said active regions.

3. The device of claim 1 wherein said device comprises an integrated circuit including bipolar transistors in said active regions.

4. The device of claim 1 wherein said dielectric material comprises a silicon oxide.

5. The device of claim 4 wherein said conductive region comprises silicon.

6. The device of claim 1 wherein said conductive region comprises silicon.

7. The device of claim 6 including means for maintaining the potential of said conducting region essentially equal to the potential of said substrate.

8. The device of claim 1 wherein the surface of said active regions are essentially coplanar with the surface of said region of dielectric material.

9. The device of claim 1 wherein said semiconductor comprises silicon.

10. A device comprising 1) a substrate, 2) first and second active regions comprising silicon, 3) a region of dielectric material, said dielectric material positioned and configured to limit interaction of charge or electric field through said substrate and 4) transistors in said first and second active regions, said transistors comprising a gate, source, and drain CHARACTERIZED IN THAT said dielectric material occupies a trench between said first and second active region, the surface of said region of dielectric material extends at least 200Å above the plane of the surface of said active region, directly underneath where said gate crosses said dielectric material and in that the dopant level in said silicon active regions to a depth of 1000Å from the surface of said active region at the silicon/field oxide interface is at least $10^{17}$ atoms/cm$^3$.

11. The device of claim 10 wherein said device comprises an integrated circuit including field effect transistor in said active regions.

12. The device of claim 10 wherein said device comprises an integrated circuit including bipolar transistors in said active regions.

13. The device of claim 10 wherein said dielectric material comprises a silicon oxide.

14. The device of claim 13 wherein said conductive region comprises silicon.

15. The device of claim 10 wherein said conductive region comprises silicon.

* * * * *